(12) United States Patent
Ting et al.

(10) Patent No.: US 9,178,040 B2
(45) Date of Patent: Nov. 3, 2015

(54) INNOVATIVE APPROACH OF 4F² DRIVER FORMATION FOR HIGH-DENSITY RRAM AND MRAM

(71) Applicant: Taiwan Semiconductor Manufacturing Co. Ltd., Hsin-Chu (TW)

(72) Inventors: Yu-Wei Ting, Taipei (TW); Chun-Yang Tsai, New Taipei (TW); Kuo-Ching Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/674,204

(22) Filed: Nov. 12, 2012

(65) Prior Publication Data

US 2014/0131794 A1    May 15, 2014

(51) Int. Cl.
*H01L 29/78*    (2006.01)
*H01L 29/66*    (2006.01)
*H01L 27/22*    (2006.01)
*H01L 27/24*    (2006.01)

(52) U.S. Cl.
CPC ........ *H01L 29/66666* (2013.01); *H01L 27/228* (2013.01); *H01L 27/2454* (2013.01); *H01L 27/2463* (2013.01)

(58) Field of Classification Search
USPC .......................... 257/288, 314, 324, 334, 336
See application file for complete search history.

(56) References Cited

U.S. PATENT DOCUMENTS

| 6,165,864 | A | 12/2000 | Shen et al. | |
|---|---|---|---|---|
| 2005/0001257 | A1 | 1/2005 | Schloesser et al. | |
| 2005/0083724 | A1* | 4/2005 | Manger et al. | 365/154 |
| 2008/0049486 | A1* | 2/2008 | Gruening-von Schwerin | 365/104 |

(Continued)

FOREIGN PATENT DOCUMENTS

| DE | 102007015540 A1 | 9/2008 |
|---|---|---|
| DE | 102007054641 A1 | 5/2009 |

(Continued)

OTHER PUBLICATIONS

Non Final Office Action Dated Apr. 6, 2015 U.S. Appl. No. 14/450,809.

(Continued)

*Primary Examiner* — Lynne Gurley
*Assistant Examiner* — Vernon P Webb
(74) *Attorney, Agent, or Firm* — Eschweiler & Associates, LLC

(57) ABSTRACT

Some embodiments of the present disclosure relate to a vertical MOSFET selection transistor that is configured to suppress leakage voltage in the memory cell without limiting the size of the memory cell. The memory selection transistor has a semiconductor body with first and second trenches that define a raised semiconductor structure having a source region, a channel region, and a drain region. A gate structure has a first gate electrode in the first trench, which extends vertically along a first side of the raised semiconductor structure, and a second gate electrode in the second trench, which extends vertically along an opposite, second side of the raised semiconductor structure. The first and second gate electrodes collectively control the flow of current between the source and drain region in the raised semiconductor structure. An electrical contact couples the drain region to a data storage element configured to store data.

19 Claims, 7 Drawing Sheets

(56) References Cited

U.S. PATENT DOCUMENTS

| | | |
|---|---|---|
| 2010/0059837 A1 | 3/2010 | Kim et al. |
| 2010/0232200 A1* | 9/2010 | Shepard .................... 365/51 |
| 2010/0237397 A1 | 9/2010 | Uchiyama |
| 2011/0188288 A1 | 8/2011 | Minami |
| 2011/0254067 A1 | 10/2011 | Abbott et al. |
| 2012/0040528 A1 | 2/2012 | Kim et al. |
| 2012/0080725 A1 | 4/2012 | Manos et al. |
| 2012/0146223 A1 | 6/2012 | Zhao et al. |
| 2012/0256242 A1 | 10/2012 | Chang et al. |
| 2012/0273872 A1 | 11/2012 | Lim et al. |
| 2013/0062679 A1* | 3/2013 | Manabe .................... 257/306 |

FOREIGN PATENT DOCUMENTS

| | | |
|---|---|---|
| JP | 2012080100 A | 4/2012 |
| KR | 20010088040 A | 9/2001 |
| KR | 20040096460 A | 11/2004 |
| TW | 200524153 | 7/2005 |

OTHER PUBLICATIONS

U.S. Appl. No. 14/450,809, filed Aug. 4, 2014.
Notice of Allowance Dated Aug. 28, 2014 Korean Patent Application No. 10-2013-0012971.
Final Office Action Dated Aug. 31, 2015 U.S. Appl. No. 14/450,809.

* cited by examiner

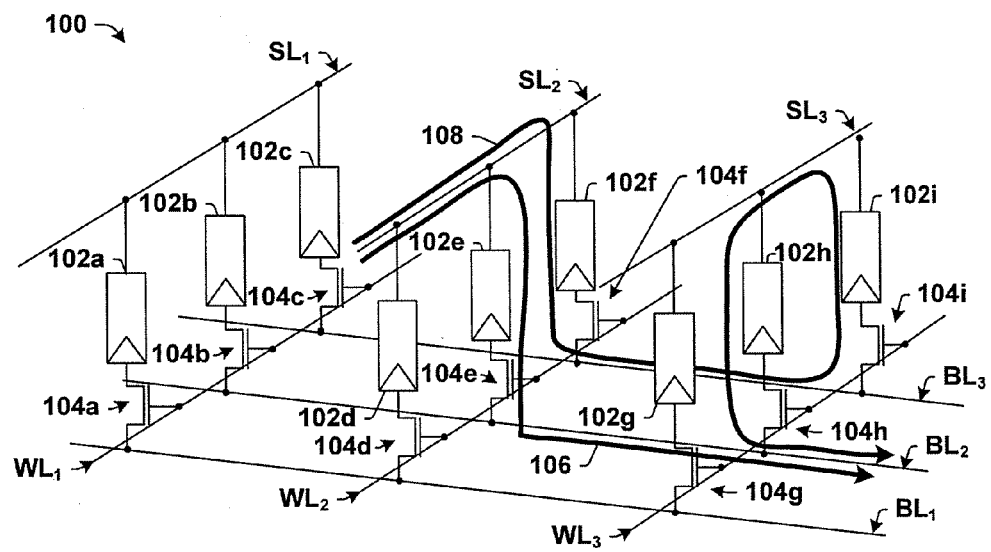
Fig. 1
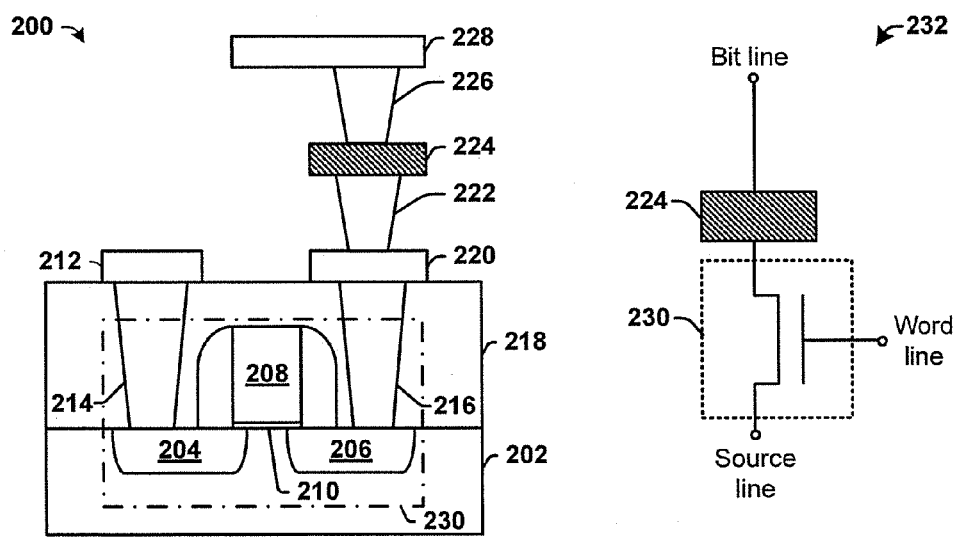
Fig. 2A
Fig. 2B

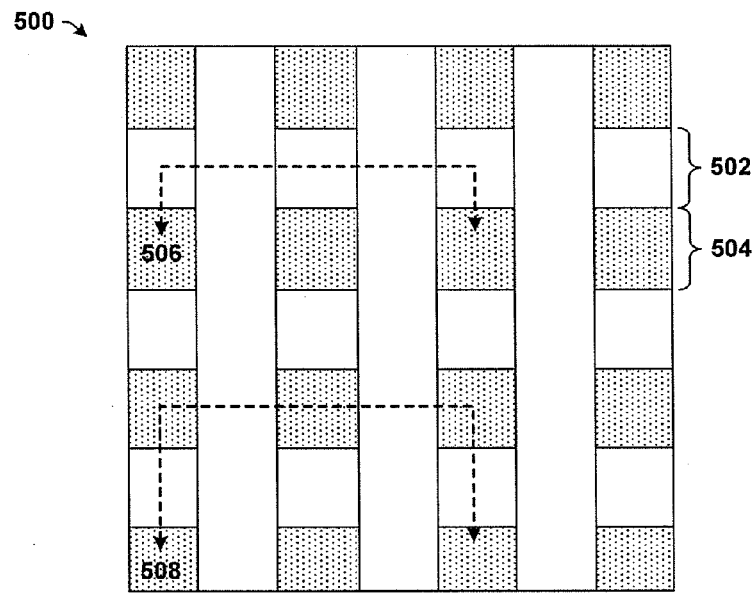
Fig. 5
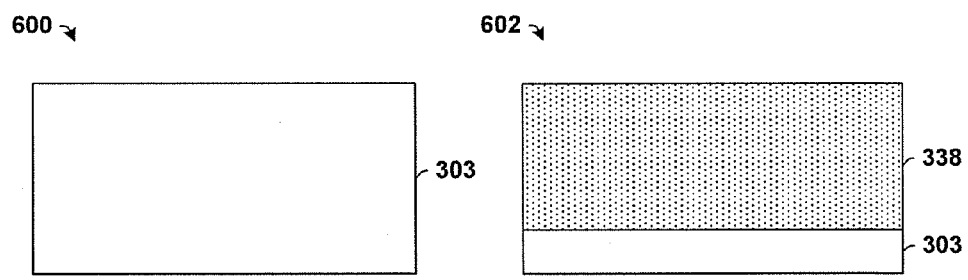
Fig. 6A        Fig. 6B

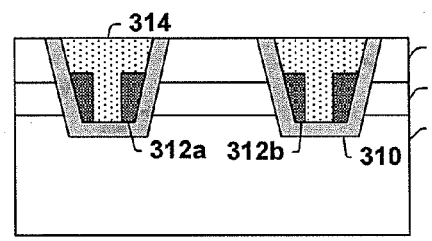 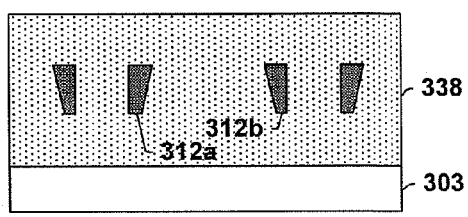
Fig. 13A                Fig. 13B
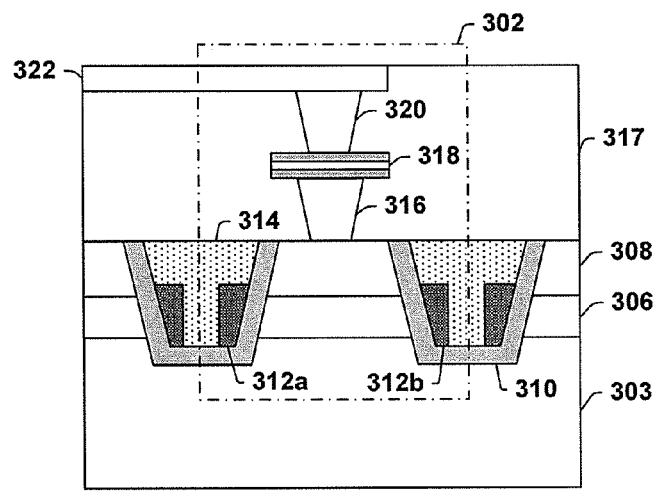
Fig. 14

INNOVATIVE APPROACH OF 4F² DRIVER FORMATION FOR HIGH-DENSITY RRAM AND MRAM

BACKGROUND

Integrated chips use memory to store data and executable programs. As the functionality of an integrated chip increases, the need for more memory also increases, causing integrated chip designers and manufacturers to have to both increase the amount of available memory while decreasing the size and power consumption of an integrated chip. To reach this goal, the size of memory cell components has been aggressively shrunk over the past few decades.

The aggressive shrinkage of memory cells has benefited from the highly repeatable pattern of memory arrays. For example, the repeatable pattern used in memory arrays has allowed for lithography to be tuned to improve the lithographic resolution of memory cells over that of other logic circuits. However, as physical dimensions continue to shrink, the physical limits of elements within the memory cell are beginning to limit the size of memory cells.

BRIEF DESCRIPTION OF THE DRAWINGS

FIG. 1 is a block diagram of a memory array illustrating a sneak path problem within the memory array.

FIG. 2A shows a cross-sectional view of a selection transistor that mitigates the sneak path problem in a memory array.

FIG. 2B shows a schematic diagram of a selection transistor in a memory array.

FIG. 5 illustrates a top view of a memory array having one or more disclosed selection transistors.

FIGS. 6A-14 are cross-sectional views of some embodiments of an example semiconductor body upon which a method of forming a selection transistor is performed.

DETAILED DESCRIPTION

Figure 3A:
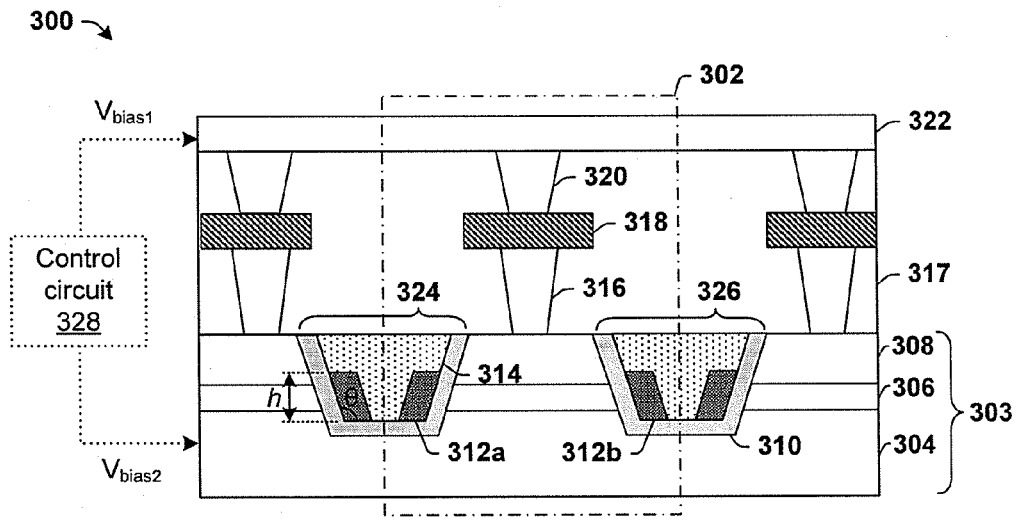
FIG. 3A illustrates a cross-sectional view of some embodiments of a disclosed selection transistor.

One or more implementations of the present disclosure will now be described with reference to the attached drawings, wherein like reference numerals are used to refer to like elements throughout. The drawings are not necessarily drawn to scale.

FIG. 1 illustrates a memory array 100 comprising a plurality of memory cells 102 configured to store data. Respective memory cells 102 are coupled between a bit line $BL_n$ and a source line $SL_n$. A selection transistor 104 is associated with each memory cell 102. The selection transistor 104 may be located between the bitline $BL_n$ and the memory cell 102. The selection transistor 104 is configured to suppress sneak-path leakage (i.e., prevent current intended for a particular memory cell from passing through an adjacent memory cell) while providing enough driving current for memory cell operation. For example, when reading data from memory cell 102e, wordline $WL_2$ is activated to turn on selection transistor 104e, while adjacent wordlines, $WL_1$ and $WL_3$, are deactivated to turn off selection transistors 104a-104c and 104g-104i and guide a current along a first path 106.

A memory cell 102 within the memory array 100 can be accessed by activating a selection transistor 104 as well as a corresponding bit line $BL_n$ and source line $SL_n$ combination. For example, to write data to memory cell 102a, selection transistor 104a is turned on, while a first voltage potential is applied to bit line $BL_1$ and a second voltage potential is applied to source line $SL_1$.

FIG. 2A illustrates a cross-sectional view of a memory cell 200 comprising a conventional planar MOSFET selection transistor 230. The selection transistor 230 comprises a source 204 and a drain 206 comprised within a semiconductor body 202. A gate electrode 208 is located on the semiconductor body 202 at a position that is above the source 204 and drain 206. The gate electrode 208 is separated from the source 204 and drain 206 by a gate oxide layer 210 extending laterally over the surface of the semiconductor body 202. The source 204 is connected by way of a first metal contact 214 within a dielectric layer 218 to a source line 212 comprised within a first metallization layer. The drain 206 is connected by to a data storage element 224 by way of one or more metal contacts 216, 222 and/or metallization layers 220. The data storage element 224 is further connected to a bit line 228 comprised within an upper metallization layer by way of an additional metal contact 226. FIG. 2B illustrates a schematic diagram 232 showing the connection of a source line to the bit line in memory cell 200.

As the size of the planar MOSFET selection transistor 230 shrinks, the leakage current of the selection transistor increases. For example, in memory array 100 of FIG. 1, if the selection transistor 104h and 104i become too small, the leakage current of the selection transistors 104h and 104i can allow current to flow along a sneak path 108 resulting in a false reading of the memory cell. To prevent leakage current the size of a conventional selection transistor can be kept large, however such a large selection transistor limits the size of the memory cell 200 to at least a size of the planar MOSFET selection transistor 230.

Accordingly, the present disclosure relates to a memory cell comprising a vertical MOSFET selection transistor that is configured to suppress leakage voltage in the memory cell without limiting the size of the memory cell. In some embodiments, the memory cell comprises a semiconductor body having first and second trenches that define a raised semiconductor structure having a source region, a channel region, and a drain region. A gate structure comprises a first gate electrode in the first trench, which extends vertically along a first side of the raised semiconductor structure. The gate structure further comprises a second gate electrode in the second trench, which extends vertically along an opposite, second side of the raised semiconductor structure. The first and second gate electrodes are configured to collectively control the flow of current between the source and drain region in the raised semiconductor structure. An electrical contact couples the drain region to a data storage element configured to store data. The vertical gate electrodes decrease the size of the selection transistor so that it does not limit the size of the memory cell.

FIG. 3A illustrates a cross-sectional view 300 of some embodiments of memory cell 302 comprising a disclosed selection transistor. In some embodiments, the memory cell 302 may comprise a resistive random access memory (RRAM) cell or a magnetic random access memory (MRAM) cell.

The memory cell 302 comprises a semiconductor body 303. The semiconductor body 303 has a source region 304 and a drain region 308. The drain region 308 is vertically separated from the source region 304 by a channel region 306.

The source region 304 extends along a length of a memory array, comprising the memory cell 302, as a source line. The source region 304 comprises a first doping type (e.g., an n-type dopant), the channel region 306 comprises a second doping type different than the first doping type, and the drain region 308 comprises the first doping type. In some embodiments, the first doping type comprises an n-type doping, while in other embodiments the first doping type comprises a p-type doping.

A first trench 324 and a second trench 326 are located within a top surface of the semiconductor body 303. The first and second trenches, 324 and 326, form a raised semiconductor structure having the source region 304, the channel region 306, and the drain region 308 stacked along the height of the raised semiconductor structure. The first and second trenches, 324 and 326, extend from a top surface of the semiconductor body 303 to a first depth. In some embodiments, the first and second trenches, 324 and 326, comprise tapered sides that form an oblique angle θ with a bottom surface of the trenches such that the size of the first and second trenches, 324 and 326, is inversely proportional to the depth of the trench (i.e., the distance from the top surface of the semiconductor body 303).

A gate structure 312 has a gate electrode 312a abutting a first side of the raised semiconductor structure and a second gate electrode 312b butting an opposite, second side of the raised semiconductor structure. The first and second gate electrodes, 312a and 312b, are electrically connected to one another so that the first and second gate electrodes collectively control the flow of current between the source region 304 and the drain region 308. The first and second gate electrodes, 312a and 312b, have a height h that is greater than a height of the channel region 306. In various embodiments, the gate structure 312 may comprise a doped polysilicon material or a metal material (e.g., TiN). The double gate structure provides for a high driving current and junction breakdown voltage.

The first and second gate electrodes, 312a and 312b, are separated from the channel region 306 by a gate oxide layer 310 that extends vertically along a sidewall of the first and second trenches, 324 and 326. Since the first and second gate electrodes, 312a and 312b, extend vertically along the channel region 306 the surface area of the semiconductor body 303 consumed by the disclosed vertical MOSFET selection transistor is reduced in comparison to a conventional planar MOSFET selection transistor.

A first metal contact 316, disposed within an inter-level dielectric layer 317, is configured to electrically couple the drain region 308 of the selection transistor to a data storage element 318 configured to store data. In some embodiments, wherein the memory cell 302 comprises a RRAM cell, the data storage element 318 comprises a dielectric structure having a resistance that can be reversibly changed by application of an appropriate voltage across the dielectric structure. For example, the dielectric structure may be set to a high resistance corresponding to a first data state with the application of a first voltage and a low resistance corresponding to a second data state with the application of a second voltage, lower than the first voltage. In other embodiments, wherein the memory cell 302 comprises a MRAM cell, the data storage element 318 comprises a stacked magnetic storage element having a pinned (i.e., permanent) magnetic layer and a free magnetic layer separated by an insulating storage layer. The resistance of the stacked magnetic structure can be changed by varying a polarity of the insulating storage layer (e.g., by generating a magnetic field due to currents applied to write lines, which are not illustrated in FIG. 3A). For example, if a polarity of the insulating storage layer is aligned with the pinned magnetic layer, the polarity of the free magnetic layer is aligned with the pinned magnetic layer and the data storage element 318 has a first resistance value corresponding to a first data state. Alternatively, if a polarity of the insulating storage layer is misaligned with the pinned magnetic layer, the polarity of the free magnetic layer is misaligned with the pinned magnetic layer and the data storage element 318 has a second resistance value corresponding to a second data state.

A second metal contact 320 is configured to further connect the data storage element 318 to a metal layer comprising a bitline 322. In some embodiments, a control circuit 328 is in communication with and is configured to selectively bias the bitline 322 and the source region 304 to access (e.g., write data to or read data from) the data storage element 318. The control circuit 328 is configured to access the data storage element 318. For example, the control circuit 328 is configured to apply a first bias voltage $V_{bias1}$ to the data storage element 318 by way of bitline 322 and a second bias voltage $V_{bias2}$ to the data storage element 318 by way of the source region 304.

Figure 3B:
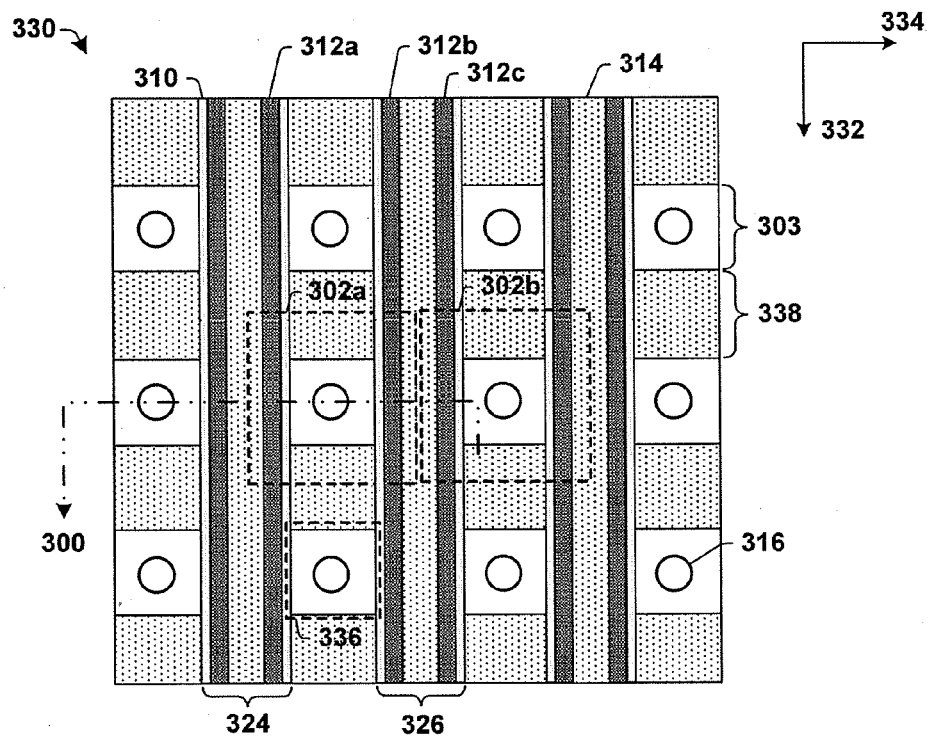
FIG. 3B illustrates a top view of some embodiments of memory array comprising a disclosed selection transistor.

FIG. 3B illustrates a top view of some embodiments of a memory array 330 comprising a plurality of memory cells 302, respectively comprising a disclosed selection transistor.

The memory array 330 comprises a plurality of trenches 324, 326 extending along a first direction 332. The trenches 324, 326 are disposed within a surface of the semiconductor body 303. The trenches 324 and 326 are filled with a dielectric material 314 (e.g., a local isolation oxide) that provides isolation between adjacent selection transistors in a second direction 334, perpendicular to the first direction. The plurality of trenches 324, 326 further comprise multiple gate electrodes 312 extending along opposite sides of the trenches in the first direction 332. For example, trench 326 comprises a first gate electrode 312b extending along a first side of the trench and a second gate electrode 312c extending along an opposite, second side of the trench.

In the second direction 334, perpendicular to the first direction 332, the memory array 330 comprises a surface having alternating rows of semiconductor body 303 and a dielectric material 338. The rows of dielectric material 338 provide for isolation between adjacent selection transistors in the first direction 332. In some embodiments, the rows of dielectric material 338 may comprise a shallow trench isolation (STI).

The plurality of trenches 324, 326 pass through the semiconductor body 303 and the rows of dielectric material 338. Together, the rows of dielectric material 338, along with the plurality of trenches 324, 326 define a plurality of raised semiconductor structures 336 respectively having a drain region vertically separated from a source region by a channel region. The drain region is connected to a data storage element by way of a first metal contact 316 located on the raised semiconductor structure 336.

Respective memory cells 302 intersect adjacent trenches so that the selection transistor within a memory cell comprises a first gate structure in a first trench and a second gate electrode in a second trench. For example, memory cell 302a intersects the first and second trenches, 324 and 326, so that a selection transistor comprise a double gate vertical MOSFET transistor having a first gate structure 312a in a first trench 324 and a second gate structure 312b in a second trench 326.

Figure 4:
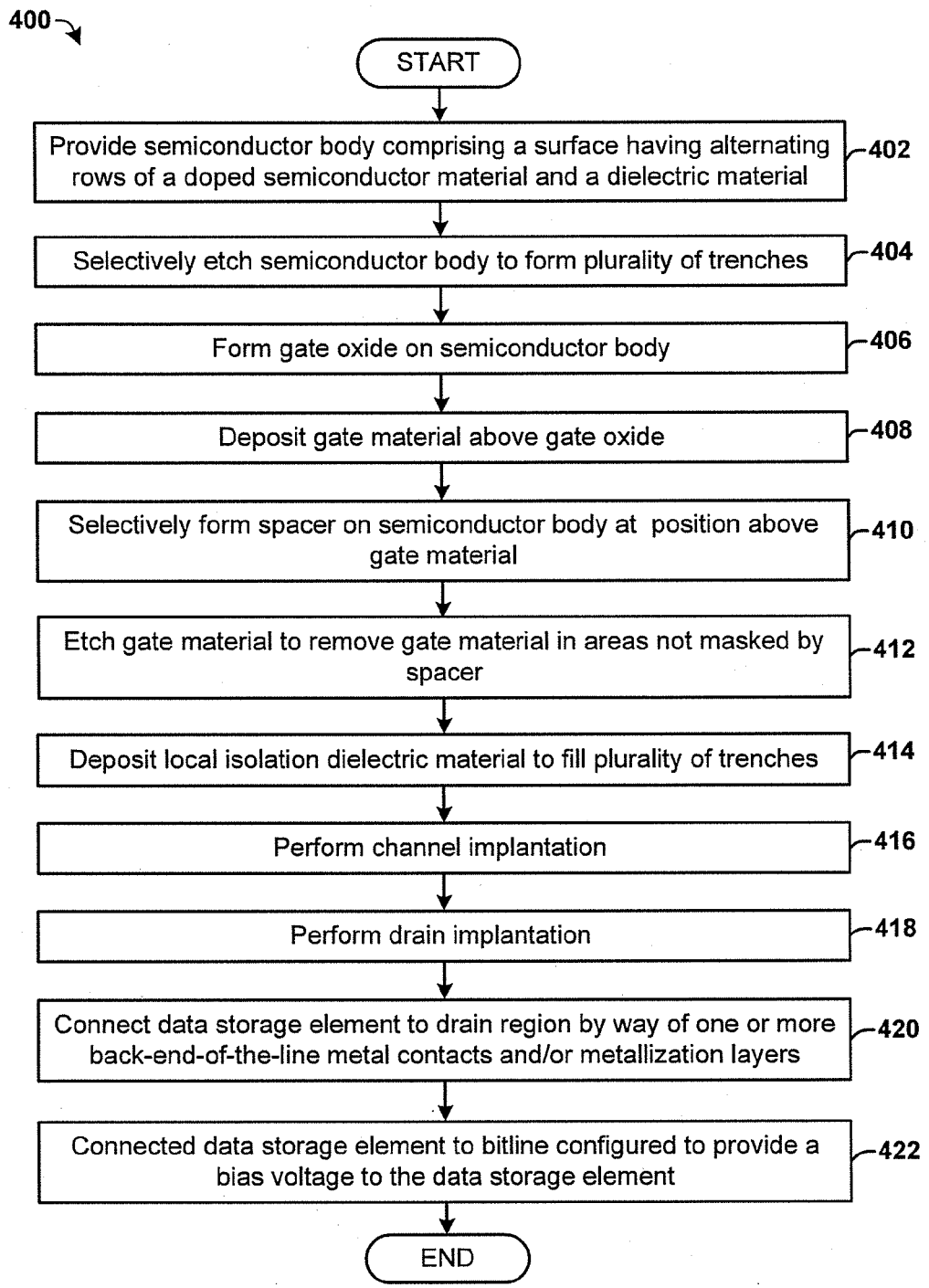
FIG. 4 is a flow diagram of an exemplary embodiment of a method for forming a selection transistor in a memory array.

FIG. 4 is a flow diagram of an exemplary embodiment of a method 400 for forming a disclosed vertical MOSFET selection transistor in a memory array.

While method 400 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 402, a semiconductor body comprising a surface having alternating rows of a doped semiconductor material and a dielectric material is provided. In some embodiments, the semiconductor body comprises a silicon starting material, such as a single-crystal silicon with a <100> orientation, which has an n-type or p-type dopant concentration, along with STI trenches formed along rows of the substrate.

At 404, the semiconductor body is selectively etched to form a plurality of trenches within a top surface of the semiconductor body. In some embodiments, the semiconductor body is selectively masked by forming a first masking layer on a top surface the semiconductor body, which defines a location of the plurality of trenches. The substrate is then selectively etched in open areas of the first masking layer.

At 406, a gate oxide layer is formed on the semiconductor body. The gate oxide layer is conformally deposited onto the semiconductor body, so that the gate oxide layer is deposited on the bottom and sidewalls of the trenches.

At 408, a gate material is deposited on the semiconductor body at a position that is above the gate oxide layer.

At 410, a spacer is selectively formed on the semiconductor body at a position that is above the gate material. In some embodiments, the spacer comprises a silicon nitride (SiN) spacer.

At 412, the gate material is etched to remove gate material that is not masked by the spacer.

At 414 a local isolation dielectric material is deposited on the semiconductor body to fill the plurality of trenches.

At 416, a channel implantation is performed. In some embodiments, the semiconductor body is selectively masked by a second masking layer and then implanted with a channel implantation. In some embodiments, the second masking layer comprises a patterned photoresist layer, while in other embodiments the second masking layer comprises the local isolation dielectric material.

At 418, a drain implantation is performed. In some embodiments, the semiconductor body is selectively masked by a third masking layer and then implanted with a drain implantation. In some embodiments, the third masking layer comprises a patterned photoresist layer, while in other embodiments the third masking layer comprises the local isolation dielectric material.

At 420, a data storage element is connected to the drain region by way of one or more back-end-of-the-line metal contacts and/or metallization layers. In some embodiments the metal contact is formed within a dielectric layer formed above the semiconductor body. The dielectric layer is etched to form a hole that is subsequently filled with a metal to form the metal contact. In some embodiments, the metal contact may comprise tungsten. A data storage element is formed at a position that electrically contacts the metal contact.

At 422 the data storage element is connected to a bitline configured to provide a bias voltage to the data storage element. In some embodiments, the bitline comprises a metallization layer formed within a dielectric layer at a position within a back end metallization stack that is above the data storage element.

FIG. 5 illustrates a top view of a memory array 500 having one or more disclosed selection transistors. The top view illustrates the semiconductor body as having a first section 502 that comprises a doped semiconductor material and a second section 504 that comprises a shallow trench isolation formed above the doped semiconductor material.

FIGS. 6A-14 illustrate cross-sectional views of some embodiments of an exemplary semiconductor body, whereon such a methodology 400 is implemented. The cross-sectional views illustrate cross sections along a first line 506 that passes through the first section 502 of the semiconductor body that has the doped semiconductor material, and along a second line 508 that passes through the second section 504 of the semiconductor body that has a shallow trench isolation above the doped semiconductor material.

FIGS. 6A-6B illustrate cross-sectional views 600 and 602 of some embodiments of a semiconductor body corresponding to the semiconductor body of act 402. Cross-sectional view 600 illustrates a section of the semiconductor body comprising a semiconductor body 303 having a non-epitaxial, n-type silicon substrate. Cross-sectional view 602 illustrates a section of the semiconductor body 303 having a dielectric material 338 formed above a non-epitaxial, n-type silicon substrate. In some embodiments, the dielectric material 338 may comprise a shallow trench isolation.

Figures 7A, 7B:
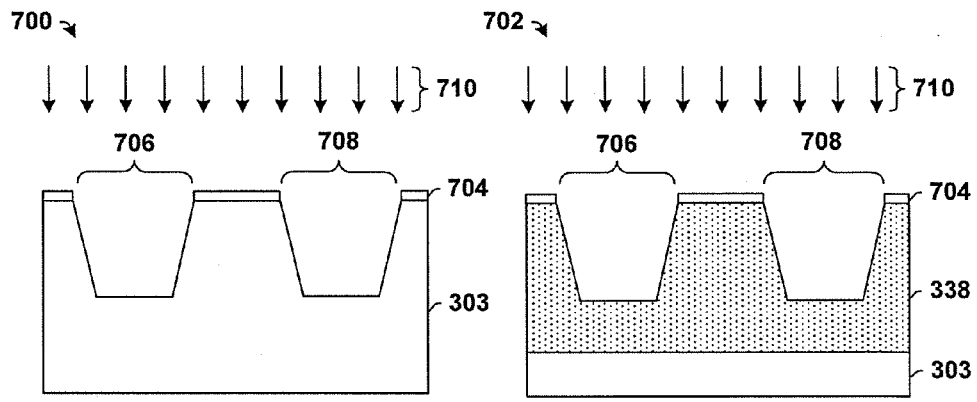

FIGS. 7A-7B illustrate cross-sectional views 700 and 702 of some embodiments of an etching process of the semiconductor body, which corresponds to act 404. As shown in cross-sectional view 700 (along the first section 502 of the semiconductor body), the top surface of the semiconductor body 303 is selectively masked with a first masking layer 704 having openings 706 and 708, before being exposed to an etchant 710. The etchant 710 removes the semiconductor body 303 at the location of the openings 706 and 708. As shown in cross-sectional view 702 (along the second section 504 of the semiconductor body), the top surface of the dielectric material 338 is selectively masked with the first masking layer 704 having openings 706 and 708, before being exposed to the etchant 710. The etchant 710 removes the dielectric material 338 at the openings 706 and 708.

In some embodiments, the first masking layer 704 comprises a patterned photoresist layer. The patterned photoresist layer may be formed on the top surface of the semiconductor body by spin coating photoresist onto the semiconductor body. The spin coated photoresist is then patterned by selective exposure to a light source (e.g., UV light) and subsequently developed. In other embodiments, the first masking layer 704 comprises a hard mask. In some embodiments, the etchant 710 comprises a wet etchant such as potassium hydroxide (KOH) or Tetramethylammonium hydroxide (TMAH). Selectively etching the semiconductor body with KOH results in trenches having a tapered side with an angle of 54.7° with the bottom surface of the trench (i.e., 35.3° from the normal). In other embodiments, the etchant 710 comprises a dry etchant (e.g., an RIE etchant). After etching is completed, the first masking layer 704 is removed.

Figures 8A, 8B:
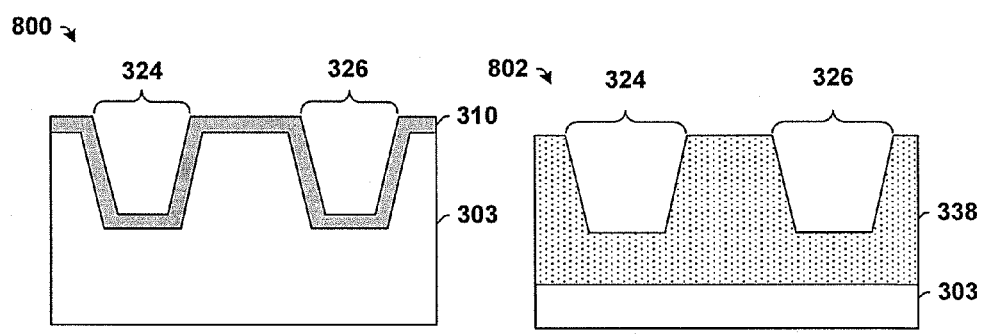

FIGS. 8A-8B illustrate some embodiments of cross-sectional views 802 and 804 showing the formation of a gate oxide layer 310 on the semiconductor body, which corresponds to act 406. As shown in cross-sectional view 800, the gate oxide layer 310 is formed to be conformal to semiconductor body, so that the gate oxide layer 310 is formed on the bottom and sidewalls of trenches 324 and 326. In some embodiments, the gate oxide layer 310 may be formed by a thermal oxide growth process. In other embodiments, the gate oxide layer 310 may be formed using a physical vapor deposition or a chemical vapor deposition technique (e.g., low pressure CVD, plasma enhanced CVD, etc.). The chemical vapor deposition provides for a multi-directional deposition that results in a conformal deposition on the top and side surfaces of the trenches and substrate. In some embodiments, the gate oxide layer 310 comprises silicon dioxide ($SiO_2$).

Figures 9A, 9B:
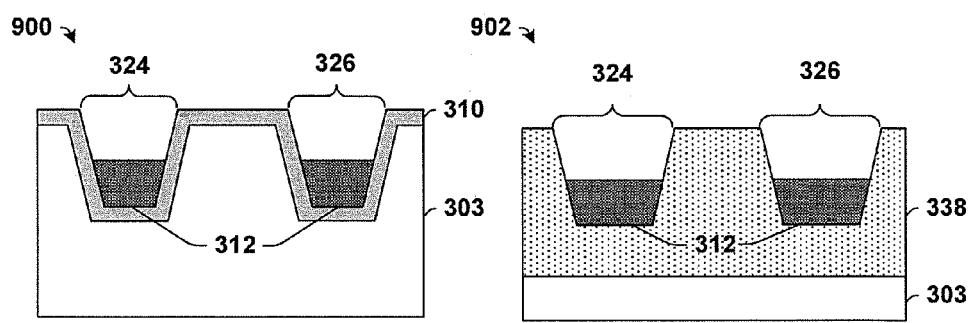

FIGS. 9A-9B illustrate some embodiments of cross-sectional views 900 and 902 showing the deposition of a gate material 312 on the semiconductor body, which corresponds to act 408. As shown in cross-sectional views 900, along a first section of the semiconductor body the gate material 312 is deposited at a position that is above the gate oxide layer 310. As shown in cross-sectional views 900, along a second section of the semiconductor body the gate material 312 is also above the dielectric material 338. The gate material 312 fills the bottom of the trenches, 324 and 326, so that the gate material 312 extends across a width of the trenches.

In some embodiments, the gate material 312 may be deposited using a physical vapor deposition technique (e.g., sputtering) or a chemical vapor deposition technique. Physical vapor deposition provides for a highly directional deposition that results in a non-conformal deposition that is predominately on the bottom of the trenches, 324 and 326, but not on the sidewalls of the trenches, 324 and 326. In various embodiments, the gate material 312 may comprise a metal material (e.g., TiN) or a doped polysilicon material. In some embodiments, chemical mechanical polishing is performed after deposition of the gate material 312 to remove excess gate material 312 from areas of the semiconductor body outside of the trenches, 324 and 326.

Figures 10A, 10B:
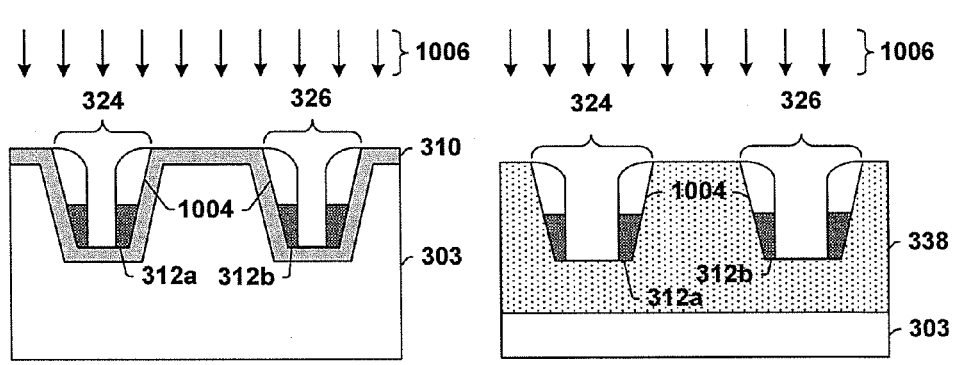

FIGS. 10A-10B illustrate cross-sectional views 1000 and 1002 of some embodiments of an etching process of the gate material 312, which corresponds to acts 410-412. As shown in cross sections 1000 and 1002, in the first and second sections of the semiconductor body, a spacer 1004 is formed within the trenches, 324 and 326, at a position above the gate material 312. In some embodiments, the spacer 1004 comprises a silicon nitride (SiN) material. The semiconductor body is subsequently exposed to an etchant 1006, which removes the gate material 312 within a trench (e.g., 324) at an opening in the spacer 1004, resulting in two separate gate electrodes 312a and 312b within a trench. In some embodiments, the etchant 1006 comprises a wet etchant comprising a nitric acid and/or a hydrofluoric acid. In other embodiments, the etchant 1006 comprises a dry etchant such as a RIE etching plasma etching or ion beam etching using $Cl_2$.

Figures 11A, 11B:
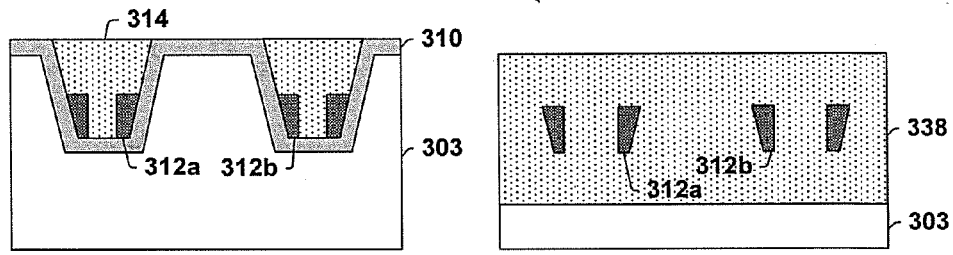

FIGS. 11A-11B illustrate cross-sectional views 1100 and 1102 of some embodiments of the deposition a local isolation dielectric material 314 (e.g., oxide), which corresponds to act 414. As shown in cross sections 1100 and 1102, the local isolation dielectric material 314 is deposited to a depth that fills the trenches, 324 and 326. In some embodiments, chemical mechanical polishing is performed after deposition of the local isolation dielectric material 314 to remove excess local isolation dielectric material from areas of the semiconductor body that are outside of the trenches. The local isolation dielectric material 314 may be deposited using a physical vapor deposition technique or a chemical vapor deposition technique, in various embodiments.

Figures 12A, 12B:
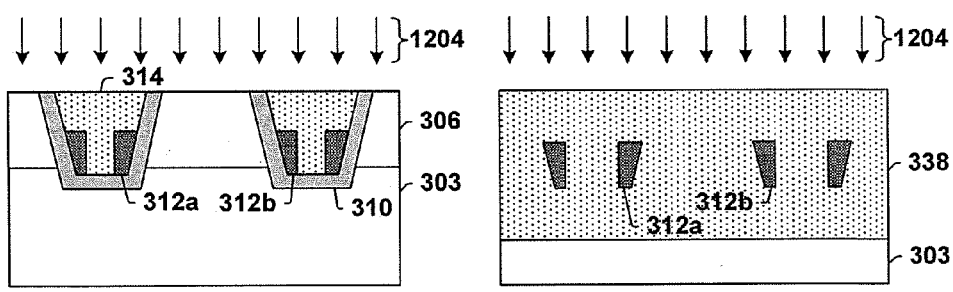

FIG. 12A-12B illustrate cross-sectional views 1200 and 1202 of some embodiments of a channel implantation 1204 of the semiconductor body 303, which corresponds to act 416. The channel implantation 1204 provides a desired implant dose having a second doping type, into one or more regions of the semiconductor body having a first doping type. The channel implantation 1204 may comprise the implantation of a p-type dopant (e.g., boron, gallium, etc.) or an n-type dopant (e.g., phosphorus, arsenic, etc.) into the semiconductor body. In some embodiments, the channel implantation is driven into the semiconductor body by diffusing the implanted dopants to a desired depth within the semiconductor body. In some embodiments, the channel implantation is driven into the semiconductor body by exposing the semiconductor body to an elevated temperature. The channel implantation can be driven into the semiconductor body to a various depths depending on the temperature and time of the drive in.

FIGS. 13A-13B illustrate cross-sectional views 1300 and 1302 of some embodiments of a drain implantation 1304 of the semiconductor body 303, which corresponds to act 418. The drain implantation 1304 provides a desired implant dose having a first doping type, into one or more regions of the semiconductor body having a first doping type. The drain implantation 1304 may comprise the implantation of a p-type dopant (e.g., boron, gallium, etc.) or an n-type dopant (e.g., phosphorus, arsenic, etc.) into the semiconductor body.

FIG. 14 illustrates a cross-sectional view 1400 showing some embodiments of the formation of back-end-of-the-line components, which corresponds to acts 420 and 422. In some embodiments, a first metal contact 316 is formed within an inter-level dielectric (ILD) layer 317 located on the top surface of the semiconductor body 303. In some embodiment, the first metal contact 316 comprises a titanium (Ti) or titanium nitride (TiN) plug. A data storage element 318 is formed above the first metal contact 316. A second metal contact 320 is formed within the ILD layer 317 above the data storage element 318. In some embodiments, the first and second metal contacts, 316 and 320, may be formed in separate ILD layers. A bitline 322 is formed within the ILD layer above the data storage element 318. In some embodiments, the bitline 322 may be formed in a separated ILD layer than the first and second metal contacts, 316 and 320.

It will be appreciated that while reference is made throughout this document to exemplary structures in discussing aspects of methodologies described herein, those methodologies are not to be limited by the corresponding structures presented. For example, the methodologies set forth in FIG. 4 are not limited to the structure presented in FIGS. 5-14. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a vertical MOSFET selection transistor that is configured to suppress leakage voltage in the memory cell without limiting the size of the memory cell.

In some embodiments, the present disclosure relates a memory cell. The memory cell comprises a semiconductor body having a first trench and a second trench that form a raised semiconductor structure having a source region and a drain region vertically separated by a channel region, wherein the first and second trenches extend within the semiconductor body to a depth that is greater than that of the channel region. A first gate electrode is comprised within the first trench and vertically extends along a first side of the raised semiconductor structure. A second gate electrode is comprised within the second trench and vertically extends along an opposite, second side of the raised semiconductor structure. A first metal contact is comprised within a dielectric material disposed on the semiconductor body and is configured to couple the drain region to a data storage element configured to store data.

In other embodiments, the present disclosure relates to a memory array. The memory array comprises a semiconductor body having a surface having alternating rows of a doped semiconductor material and a dielectric material that extend along a first direction. A plurality of trenches are located within the surface to define a plurality of raised semiconductor structures respectively having a drain region vertically separated by a channel region from a source region extending below the plurality of trenches. The plurality of trenches respectively comprise a first gate electrode vertically extending along a first side of the trench, and a second gate electrode vertically extending along an opposite, second side of the trench. A plurality of metal contacts are disposed within a dielectric layer on the semiconductor body and configured to couple the respective drain regions to a data storage element configured to store data.

In other embodiments, the present disclosure relates to method of forming a selection transistor in a memory array. The method comprises providing a semiconductor body comprising a surface having alternating rows of a doped semiconductor material and a dielectric material. The method further comprises selectively etching the semiconductor body to form a first trench and a second trench perpendicular to the alternating rows, wherein the first trench and the second trench define a raised semiconductor structure. The method further comprises depositing a gate oxide layer on the semiconductor body and forming a first gate electrode at a first position within the first trench that vertically extends along a first side of the raised semiconductor structure and second gate electrode at a second position within the second trench that vertically extends along an opposite, second side of the raised semiconductor structure. The method further comprises depositing a local isolation dielectric material within first trench and the second trench. The method further comprises performing a channel implantation to form channel region within the raised semiconductor structure and performing a drain implantation to form drain region within the raised semiconductor structure. The method further comprises coupling the drain region a data storage element configured to store data.

What is claimed is:

1. A memory cell, comprising:
   a semiconductor body having a first trench and a second trench that form a raised semiconductor structure having a source region and a drain region vertically separated by a channel region, wherein the first trench and the second trench extend within the semiconductor body to a depth that is greater than that of the channel region;
   a first gate electrode comprised within the first trench and vertically extending along a first sidewall of the first trench;
   a second gate electrode comprised within the second trench and vertically extending along a second sidewall of the second trench;
   a first metal contact comprised within a dielectric material disposed over the semiconductor body and configured to couple the drain region to a data storage element configured to store data;
   an isolation dielectric material disposed within the first and second trenches at positions that vertically abut to surfaces of the first and second gate electrodes and that laterally abut sidewalls of the first and second gate electrodes; and
   wherein the first trench and the second trench comprise sidewalls that are tapered from a top surface of the raised semiconductor structure to bottom surfaces of the first and second trenches.

2. The memory cell of claim 1, wherein the first gate electrode and the second gate electrode comprise a doped polysilicon material or a metal material.

3. The memory cell of claim 1, wherein the first gate electrode and the second gate electrode vertically extend from a first position vertically above the channel region to a second position vertically below the channel region.

4. The memory cell of claim 1, wherein the data storage element comprises:
   a resistive random-access memory element comprising a dielectric structure that changes its resistive value based upon; or
   a magneto-resistive random-access memory element comprising a stacked structure having a pinned magnetic layer and a free magnetic layer separated by an insulating layer.

5. The memory cell of claim 1, wherein the first and second gate electrodes are electrically coupled.

6. The memory cell of claim 1, further comprising:
   a gate oxide layer located between the first gate electrode and the raised semiconductor structure and between the second gate electrode and the raised semiconductor structure.

7. The memory cell of claim 1, further comprising:
   a bitline electrically coupled to the data storage element by way of an additional metal contact.

8. The memory cell of claim 7, further comprising:
   a control circuit in communication with and is configured to selectively bias the bitline and the source region.

9. A memory array, comprising:
   a semiconductor body comprising a surface having alternating rows of a doped semiconductor material and a dielectric material that extend along a first direction;
   a plurality of trenches located within the surface to define a plurality of raised semiconductor structures respectively having a drain region vertically separated by a channel region from a source region extending below the plurality of trenches, wherein the plurality of trenches respectively comprise:
      a gate dielectric layer abutting a first sidewall and an opposite second sidewall of a trench;
      a first gate electrode vertically extending along the first sidewall of the trench;
      a second gate electrode spatially separated from the first gate electrode and vertically extending along the second sidewall of the trench;

a plurality of metal contacts disposed within a dielectric layer overlying the semiconductor body and configured to couple the drain region to a data storage element configured to store data;

an isolation dielectric material disposed within the plurality of trenches at positions that vertically abut to surfaces of the first and second gate electrodes and that laterally abut sidewalls of the first and second gate electrodes; and wherein entire surfaces of the first gate electrode and the second gate electrode abutting the gate dielectric layer are tapered at an oblique angle with respect to a bottom surface of the trench.

10. The memory array of claim 9, wherein the first gate electrode and the second gate electrode comprise a doped polysilicon material or a metal material.

11. The memory array of claim 9, wherein the first gate electrode and the second gate electrode vertically extends from a first position above the channel region to a second position below the channel region.

12. The memory array of claim 9, wherein gate electrodes within adjacent trenches are configured to collectively control a flow of current within the channel region of a raised semiconductor structure therebetween.

13. The memory array of claim 9, wherein the plurality of trenches comprise sidewalls that are tapered from a top surface of the semiconductor body to bottom surfaces of the plurality of trenches, so as to provide the plurality of trenches with widths that are inversely proportional a distance from the top surface.

14. The memory array of claim 9, further comprising:
a control circuit configured to selectively bias the data storage element by way of the source region and a bitline connected to the data storage element by way of an additional metal contact.

15. The memory array of claim 9, wherein the data storage element comprises:
a resistive random-access memory element comprising a dielectric structure that changes its resistive value based upon; or
a magneto-resistive random-access memory element comprising a stacked structure having a pinned magnetic layer and a free magnetic layer separated by an insulating layer.

16. The memory cell of claim 1, wherein entire surfaces of the first gate electrode and the second gate electrode facing the raised semiconductor structure are tapered at an oblique angle with respect to the bottom surfaces of the first and second trenches.

17. The memory cell of claim 1, wherein the sidewalls of the first and second trenches are tapered at an angle of 54.7° with respect to the bottom surface of the first and second trenches.

18. The memory cell of claim 1,
wherein the first gate electrode comprises a first sidewall facing the raised semiconductor structure that is tapered at an oblique angle with respect to a bottom surface of the first trench; and
wherein the first gate electrode comprises a second sidewall, opposing the first sidewall, that forms an angle with respect to the bottom surface of the first trench that is larger than the oblique angle.

19. A memory array, comprising:
a semiconductor body having a first trench and a second trench that form a raised semiconductor structure having a source region and a drain region vertically separated by a channel region, wherein the first trench and the second trench have sidewalls that are tapered from a top of the raised semiconductor structure to a depth that is greater than that of the channel region;
a gate dielectric layer having a substantially uniform thickness, which is disposed along sidewalls and bottom surfaces of the first and second trenches;
a first gate electrode disposed within the first trench at a first position abutting the gate dielectric layer along a first sidewall of the first trench;
a second gate electrode disposed within the second trench at a second position abutting the gate dielectric layer along a first sidewall of the second trench; and
an isolation dielectric material disposed within the first and second trenches at positions that vertically abut top surfaces of the first and second electrodes and that laterally abut sidewalls of the first and second gate electrodes,
wherein entire surfaces of the first gate electrode and the second gate electrode facing the raised semiconductor structure are tapered at an oblique angle with respect to the bottom surfaces of the first and second trenches.

\* \* \* \* \*

UNITED STATES PATENT AND TRADEMARK OFFICE
CERTIFICATE OF CORRECTION

| | | |
|---|---|---|
| PATENT NO. | : 9,178,040 B2 | Page 1 of 1 |
| APPLICATION NO. | : 13/674204 | |
| DATED | : November 3, 2015 | |
| INVENTOR(S) | : Yu-Wei Ting et al. | |

It is certified that error appears in the above-identified patent and that said Letters Patent is hereby corrected as shown below:

In The Claims

Column 10, Claim 1, Line 12 Please replace "...vertically abut to surfaces..." with --...vertically abut top surfaces...--

Column 11, Claim 9, Line 6 Please replace "...vertically abut to surfaces..." with --...vertically abut top surfaces...--

Signed and Sealed this
First Day of March, 2016

Michelle K. Lee
*Director of the United States Patent and Trademark Office*